United States Patent [19]

Speck

[11] Patent Number: 4,839,512

[45] Date of Patent: Jun. 13, 1989

[54] TACTILE SENSING METHOD AND APPARATUS HAVING GRIDS AS A MEANS TO DETECT A PHYSICAL PARAMETER

[75] Inventor: Richard P. Speck, Denver, Colo.

[73] Assignee: Tactilitics, Inc., Boulder, Colo.

[21] Appl. No.: 7,256

[22] Filed: Jan. 27, 1987

[51] Int. Cl.[4] .............................................. G01D 5/34
[52] U.S. Cl. ............................. 250/231 P; 250/227; 901/33; 73/777; 341/13
[58] Field of Search ............... 250/227, 231 P, 231 R; 340/347 P, 780; 901/46, 47, 33; 364/558; 73/861.47, 861.53

[56] References Cited

U.S. PATENT DOCUMENTS

| | | | |
|---|---|---|---|
| 4,526,043 | 7/1985 | Boie et al. | 901/46 |
| 4,555,954 | 12/1985 | Kim | 901/33 |
| 4,591,944 | 5/1986 | Gravel | 901/33 |
| 4,651,074 | 3/1987 | Wise | 901/47 |
| 4,695,963 | 9/1987 | Sagisawa et al. | 901/33 |

Primary Examiner—David C. Nelms
Assistant Examiner—Stephone B. Ballen
Attorney, Agent, or Firm—James R. Young

[57] ABSTRACT

Apparatus for sensing locations and magnitudes of forces applied on a surface includes a grid comprised of energy input devices running in one direction and energy output devices running another direction with the input and output devices crossing each other. Transducers that meter energy from the input devices to the output devices as a function of the magnitude of forces applied thereon are positioned at the intersections of the input devices with the output devices. Interrogation apparatus is also included, along with energy output detectors and measuring devices, for sensing and determining locations, as well as magnitudes, of forces applied on the grid. Several embodiments of energy input and energy output devices are shown and described, as well as several embodiments of transducers.

33 Claims, 7 Drawing Sheets

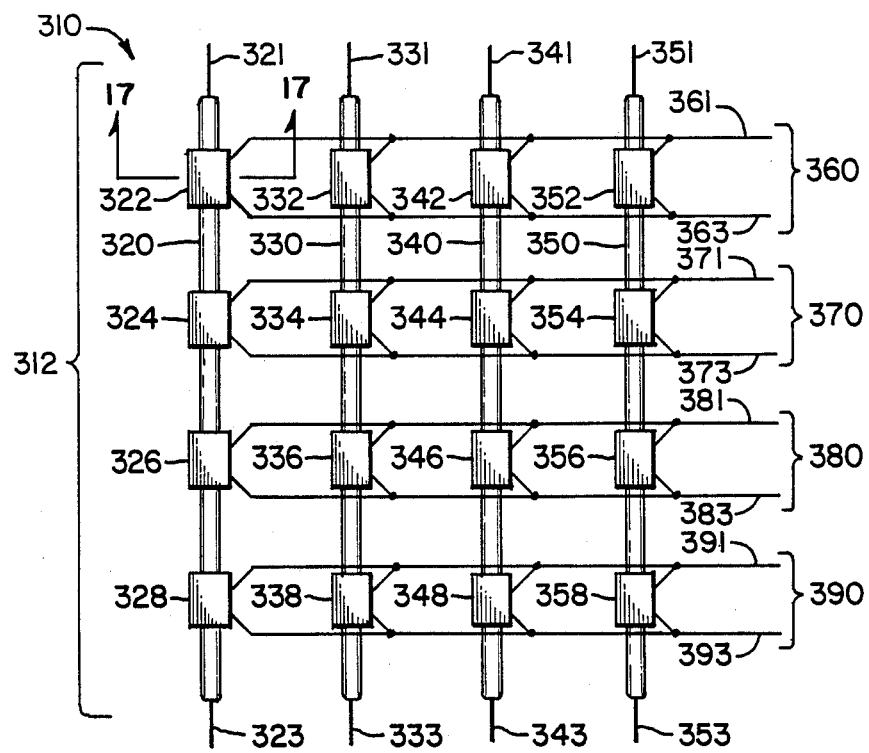
FIG. 16
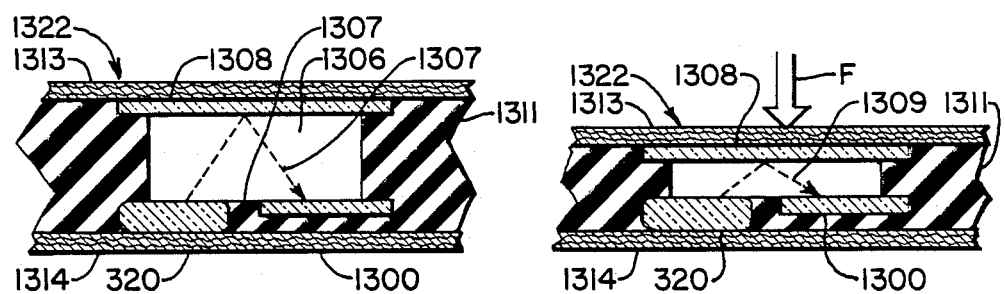
FIG. 19
FIG. 20

TACTILE SENSING METHOD AND APPARATUS HAVING GRIDS AS A MEANS TO DETECT A PHYSICAL PARAMETER

BACKGROUND OF THE INVENTION

1. Field of Invention

The present invention relates to pressure sensing devices and more particularly a tactile sensing system for sensing where and how much pressure or force is applied at specific locations of an area.

2. Description of the Prior Art

There are many situations in which it would be beneficial to be able to sense and measure the amount of force or pressure that is applied on a surface area, including specific locations in the area where such force or pressure is applied, as well as the magnitude of such force or pressure at each such location. In other words, it would be beneficial to be able to sense pressures at various parts of an area, including magnitudes, on a real time basis, similar to the way a person's nervous system can sense various pressures applied on his or her body. It would also be very desirable to monitor, record, and display an output representation of such forces or pressures on a continuous dynamic basis over a real time continuum.

The potential applications for such a tactilitic sensor system are virtually unlimited, and no attempt will be made to cover or mention even a substantial number of them here. However, an example application is appropriate to illustrate the problem. It is known that too much pressure on a point or location on a person's body sustained over an excessive period of time can cut off circulation and cell nourishment, resulting in pressure sores and even dead tissue. While most of us feel the discomfort and move or shift position to alleviate the problem before damage occurs, such pressure sores or dying tissue can be a significant problem for persons that are immobilized, comatose, disabled to the extent of lacking feeling or muscular control, or unconscious due to general anesthetics during surgery, and the like. Also, the time required for such damage to accrue is relatively short, often as little as several hours. Therefore, while it is often the job of physicians or nursing staff to reposition such persons on a regular basis to relieve problem pressure points, distractions, personnel shortages, and the like can cause such care to be undependable for the person who requires it. A suitable tactilitic monitoring system positioned to provide contact monitoring with the person's body could assist greatly in monitoring the magnitude and duration of pressure points on all locations in a defined area and provide suitable records and alarm or reminders to the nursing or caring personnel. Such a tactilitic system could also be used to indicate or sound a warning or activate a call system if a patient or even a small child gets out of bed, while not giving false alarms from mere motion or changing positions in the bed so long as some part of the system has pressure on it.

Pressure sensitive switches or transducers are, of course, known. For example, U.S. Pat. Nos. 4,484,043 and 4,565,910, issued to J. Musick, et al., and U.S. Pat. Nos. 4,179,692 and 4,295,133 issued to D. Vance, show such pressure switches or transducers used to monitor the presence of a patient in a bed. However, a single, or even several such sensors, cannot function as a true tactilitic sensor system over an area. While a normal initial reaction may be to merely multiply or add more of such sensors or switches to cover the desired area, one soon runs headlong into the pervasive problem of rapidly multiplying control and monitoring complexity that prior to this invention has not been solved in any practical sense. For example, some simple calculations show that even a relatively small area of 4'×6' with sensors or pressure transducers positioned every tenth of a foot would amount to over 2,400 switches. A modest 2 m×2 m area with sensors spaced about 2 cm apart would have over 10,000 sensors. Even with the possibility of using computers to monitor such a large number of individual switches, the problem would be enormous, not to mention the physical mass of electronic circuits and connections that would be required to connect each switch to a monitoring station. Such system would be either too unwieldy, too fragile, or both, along with a whole host of other problems that prior to this invention made such a tactilitic monitoring system impractical.

SUMMARY OF THE INVENTION

Accordingly, it is a general object of the present invention to provide a tactile sensing and monitoring system that is capable of sensing and monitoring the magnitudes and locations of forces or pressures applied on a plurality of locations on an area.

A more specific object of the present invention is to provide such a tactile sensing and monitoring system in a practical and cost effective assembly.

Another specific object of the invention is to provide a method and apparatus for sensing and monitoring a multiplicity of pressure points with an arrangement in which data from a plurality of sensors is gathered by conductors common to more than one of the sensors while maintaining location identity of each point of origin of such data.

Additional objects, advantages, and novel features of the invention are set forth in part in the description that follows, and in part will become apparent to those skilled in the art upon examination of the following specification or may be learned by the practice of the invention. The objects and advantages of the invention may be realized and attained by means of the instrumentalities, combinations, and methods particularly pointed out in the appended claims.

To achieve the foregoing and other objects in accordance with the purposes of the present invention, as embodied and broadly described herein, the apparatus of this invention may comprise a grid having a plurality of elongated energy input devices distributed in spaced apart relation to each other over a desired surface area and generally oriented in one direction and a plurality of elongated energy output devices distributed in spaced apart relation to each over the surface area generally oriented in another direction so that the input devices and output devices intersect or overlay each other. Connections are provided at the intersecting or overlaying locations for transferring energy from the input devices to the output devices. Such connections are preferably made through transducer devices that can regulate the amount of energy that can transfer from input to output devices as a function of the magnitude of external force or pressure being applied to the transducer. Thus, the energy in the output device can be a measure of the force on the transducer. This invention includes several embodiments of input, output, and transducer devices, including electrical, optical, and electro-optical combinations. This invention also includes controller and data processing features for feeding energy to selected input devices in sequential order while isolating other input devices, for detecting and measuring output energy in selected output devices while isolating other output devices, and for correlating the input and output data to obtain measurements of forces on the transducer locations of the surface.

The method of this invention may comprise the steps of feeding energy into the input devices in sequential order while isolating others and detecting and measuring energy in the output devices in sequential order while isolating others in such a manner that energy being detected and measured can be correlated with data of the input device being fed and the output device being read to indicate the location of the transducer through which energy is being transferred from input to output and for determining the force being applied to that transducer at that time. The method also includes processing and storing the data and providing an output of data showing forces on the various transducer locations on a real time basis.

BRIEF DESCRIPTION OF THE DRAWINGS

The accompanying drawings, which are incorporated, in and form a part of, the specifications illustrate the preferred embodiments of the present invention, and together with the description serve to explain the principles of the invention.

In the drawings:

FIG. 16 is a partial schematic diagram of a tactilitic sensor system according to the present invention that utilizes photoelectric transducers;

FIG. 19 is a cross section of an alternate embodiment photoelectric transducer that can be used as a substitute for that shown in FIG. 17;

FIG. 20 is a cross section of the alternate embodiment photoelectric transducer of FIG. 19 shown with a force or pressure applied thereto;

DESCRIPTION OF THE PREFERRED EMBODIMENTS

Figure 1:
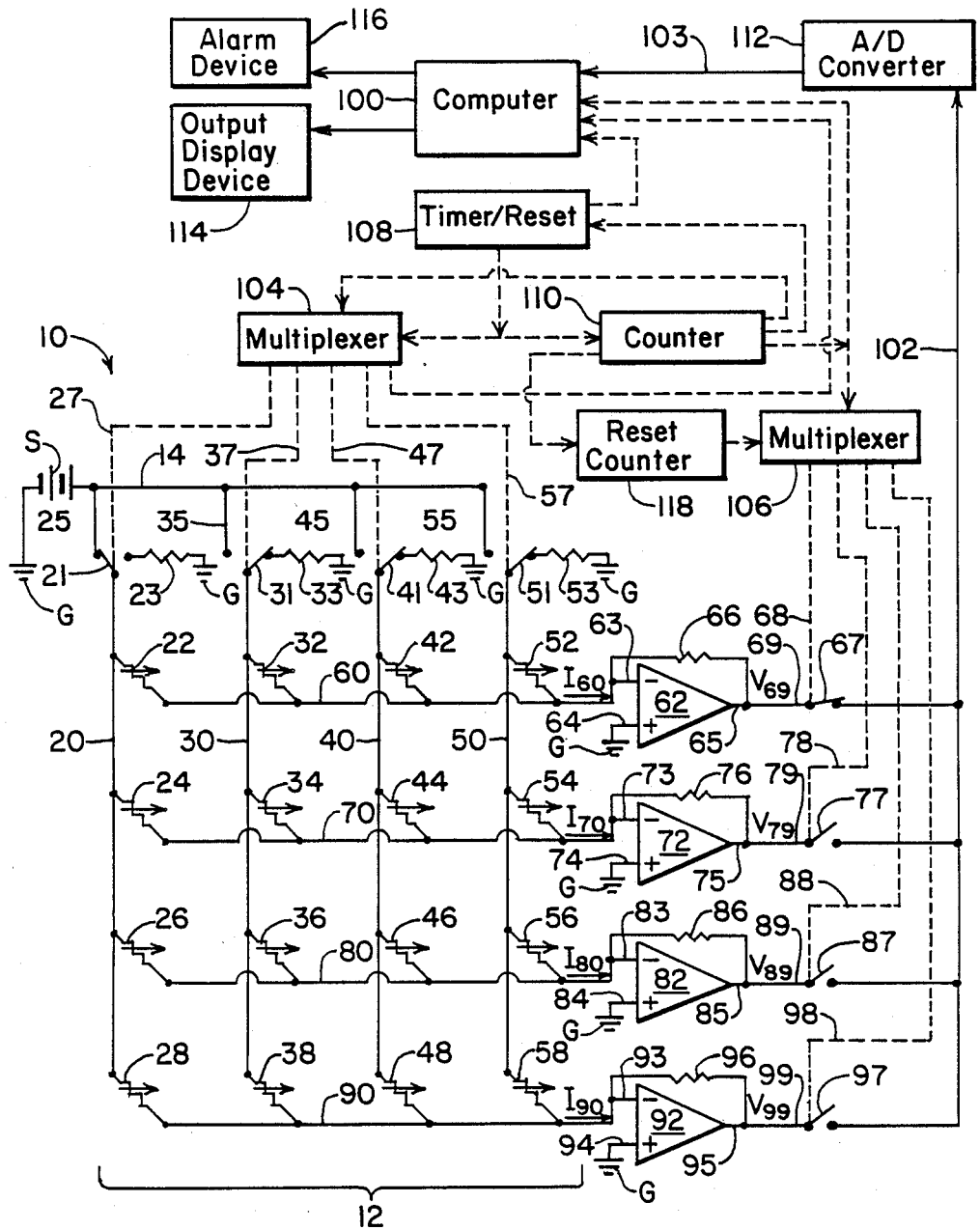
FIG. 1 is a schematic diagram of the electrical circuit for the preferred embodiment tactilitic sensor of this invention.

A tactile sensing system 10 according to the present invention is shown in schematic in FIG. 1. Such a system according to this invention can be fabricated in a flexible or rigid mat or even a blanket or bed sheet embodiment (not shown) of a sufficient size that it covers the desired surface area over which pressures or forces are desired to be detected and monitored.

The tactile sensing system 10 according to this invention has a grid 12 of elongated input and output devices dispersed over the desired area with the input devices oriented substantially perpendicular to, and intersecting, the output devices. In the system 10 shown in FIG. 1, the input and output devices include elongated electrical conductors. For convenience, the grid 12 is illustrated in FIG. 1 with four input devices in the form of electric conductor leads 20, 30, 40, 50 positioned parallel and in spaced apart relation to each other over the desired surface area. It also has four output devices in the form of electric conductor leads 60, 70, 80, 90 positioned parallel and in spaced-apart relation to each other and in perpendicular relation to the input leads 20, 30, 40, 50. While this illustration utilizes these four parallel input leads 20, 30, 40, 50 in perpendicular relation to the four parallel output leads 60, 70, 80, 90, the grid can be any desired size or configuration with any desired number of leads and spacings between leads to cover a desired area utilizing the same principles as will be described for this system 10.

Feeder leads, 25, 35, 45, 55 connect the input leads 20, 30, 40, 50, respectively, to a current source S through respective switch devices 21, 31, 41, 51. The switch devices 21, 31, 41, 51 can also connect the respective input leads 20, 30, 40, 50 to ground G through respective resistors 23, 33, 43, 53. The switch devices 21, 31, 41, 51 are preferably controlled by a multiplexer device 104 that is programmed to connect each of the input leads 20, 30, 40, 50 to the source S sequentially while the others are held to ground G, as will be described more fully below. The multiplexer device 104 is shown connected to the switch devices 21, 31, 41, 51 by control leads 27, 37, 47, 57, respectively. The switch devices 21, 31, 41, 51 can, of course, be in the form of relays, transistors, or other appropriate solid state switching devices known to persons skilled in the electronics art.

The input leads 20, 30, 40, 50 are connected to the output leads 60, 70, 80, 90 at intersecting locations of the grid 12 by transducer switch devices 22, 24, 26, 28, 32, 34, 36, 38, 42, 44, 46, 48, 52, 54, 56, 58. Specifically, the input lead 20 is connected at intersecting locations to output leads 60, 70, 80, 90 by transducers 22, 24, 26, 28, respectively. Likewise, the input lead 30 is connected at intersecting locations to output leads 60, 70, 80, 90 by transducers 32, 34, 36, 38, respectively. Input lead 40 is connected at intersecting locations to output leads 60, 70, 80, 90 by transducers 42, 44, 46, 48, respectively. Finally, to complete this grid 12, input lead 50 is connected at intersecting locations to output leads 60, 70, 80, 90 by transducers 52, 54, 56, 58, respectively.

The transducers 22, 24, 26, 28, 32, 34, 36, 38, 42, 44, 46, 48, 52, 54, 46, 58 can be in any of a number of structural forms, some of which will be discussed in more detail below. Suffice it to say at this point for describing this embodiment 10 of this tactile sensing invention that each transducer is a variable switch device through which current or voltage can be transferred from an input lead 20, 30, 40, 50 to an output lead 60, 70, 80, 90, and in which the magnitude of the current or voltage so transferred varies as a function of the magnitude of external pressure or force applied to the location of the transducer switch. In other words, in the example of grid 12 in FIG. 1, as the force applied to a transducer increases, the current or voltage transferred from an input lead to an output lead at that location where the force is applied also increases proportionately.

Each output lead 60, 70, 80, 90 is attached to an operational amplifier 62, 72, 82, 92, respectively. Each operational amplifier, such as op-amp 62, is preferably wired in the form of a current-to-voltage converter, as shown in FIG. 1, with the output lead 60 of grid 12 connected directly to the inverting input 63, with a feedback resistor 66 connecting the inverting input 63 to the output 65, and with the non-inverting input 64 connected to ground. The power supply or bias leads of the op-amps 62, 72, 82, 92 are not shown, but they are presumed to be there, as is conventional practice in this field.

When wired in this manner, the current $I_{60}$ from grid output lead 60 is applied directly to the inverting input 63 of the op-amp 62. The resulting output voltage $V_{69}$ on lead 69 is a function of the current $I_{60}$, expressed as follows:

$$V_{69} = (I_{60} + I_b)R_{66}$$

where $I_b$ is the input bias current and $R_{66}$ is the resistance of resistor 66. Since $I_b$ and $R_{66}$ are constant, the output voltage $V_{69}$ on lead 69 varies in direct relation to the current $I_{60}$ in lead 60. Further, since current $I_{60}$ varies as a function of the magnitude of the external pressure or force applied to a selected one of the transducers 22, 32, 42, 52, the output voltage $V_{69}$ varies as a function of the pressure or force applied on the selected transducer. The transducer selection process is described in more detail below. However, to complete the description of the purpose of the op-amp circuit function in this invention, it is sufficient to say at this point that the output voltage $V_{69}$ of op-amp 62 can be utilized as a measure of the pressure or force applied on any one of the tranducers 22, 32, 42, 52 at selected times.

In a similar manner, the inverting inputs 73, 83, 93 of respective op-amps 72, 82, 92 are connected by respective resistors 76, 86, 96 to respective op-amp outputs 75, 85, 95, with respective non-inverting inputs 74, 84, 94 grounded. Therefore, these op-amps 72, 82, 92 also function as current-to-voltage converters similar to that described above for op-amp 62. Thus, when current $I_{70}$ from grid output lead 70 is applied directly to the inverting input 73 of op-amp 72, the resulting output voltage $V_{79}$ on output lead 79 varies directly as a function of the current $I_{70}$. Likewise, connecting grid output lead 80 to inverting input 83 of op-amp 82 results in an output voltage $V_{89}$ on output lead 89 that varies directly as a function of the current $I_{80}$ in output lead 80. Also, connecting grid output lead 90 to the inverting input 93 of op-amp 92 results in an output voltage $V_{99}$ on output lead 99 that varies directly as a function of the current $I_{90}$ in output lead 90.

Consequently, in a similar manner to that described above for grid output lead 60, the output voltage $V_{79}$ can be utilized as a measure of the pressure or force applied on any one of the transducers 24, 34, 44, 54 at selected times. The output voltage $V_{89}$ can be utilized as a measure of the pressure or force applied on any of of the transducers 26, 36, 46, 56 at selected times. Also, the output voltage $V_{89}$ can be utilized as a measure of the pressure or force applied on any one of the transducers 28, 38, 48, 58 at selected times.

In order to make record, store, and process the output voltage measurements of op-amps 62, 72, 82, 92, the output leads 69, 79, 89, 99 can be connected to an analog-to-digital converter 112 by lead 102, and the digital voltage data can then be fed through leads 103 to an appropriate computer 100. The computer 100 can measure, store, and process the output voltage data from op-amps 62, 72, 82, 92. The computer 100 can then output the processed data to an appropriate display device 114, such as a graphical plotter or CRT, and to any desired audio or visual alarm device 116, as desired.

A significant feature of this invention is the use of a grid structure 12 for sensing and feeding the pressure or force data from the plurality of pressure or force sensing locations over the desired surface area. In order to utilize this grid structure 12 in this manner, this invention provides a method and apparatus for isolating and measuring data from individual locations in a rapidly cycling sweep pattern.

Specifically, in the embodiment illustrated in FIG. 1, as already described above, each input line 20, 30, 40, 50 of grid 12 can be connected to a current source S by respective switch devices 21, 31, 41, 51. The switch devices 21, 31, 41, 51 can also connect each respective input line 20, 30, 40, 50 to ground G through respective resistors 23, 33, 43, 53. The mode of each switching device 21, 31, 41, 51, i.e., connected to source S or to ground G, is preferably controlled by a multiplexer device 104 through respective control connections 27, 37, 47, 57.

As used in this embodiment shown in FIG. 1, only one of the input lines 20, 30, 40, 50 is connected to current source S at a time, whlie the remaining input lines are held to ground G. For example, as illustrated in FIG. 1, switching device 21 has input line 20 connected to current source S, while switching devices 31, 41, 51 are holding the input lines 30, 40, 50, respectively, to ground G. In this condition, current being fed into input line 20 can potentially flow through any one of the transducers 22, 24, 26, 28 into output lines 60, 70, 80, 90, respectively. Preferably the current source S will be of a type to maintain a constant voltage on the selected line 20 so that the current through transducer 22 will not depend upon the condition of transducers 24, 26 or 28.

As described briefly above, the transducers are preferably variable switch devices in which the current allowed to flow therethrough varies as a function of the external pressure or force applied. Example transducer devices will be described in more detail below.

Consequently, in the illustration of FIG. 1, if there is an external pressure or force applied to the grid 12 at the location of transducer 22, then current $I_{60}$ will flow from input line 20, through transducer 22, and through output line 60 to the inverting input of op-amp 62. The magnitude of the current $I_{60}$ will depend on the magnitude of pressure or force applied on the transducer 22. The measurement of that force or pressure, as described above, is read by the computer 100 as a function of the output voltage $V_{69}$ from the op-amp 62.

The resistors 23, 33, 43, 53 are preferably very low in resistance compared to the resistance ranges of the transducers. Therefore, any leakage from input line 20 through transducers 24, 26, 28 and back through any of the other transducers in the grid to other input lines 30, 40, 50 will be shunted to ground G, instead of interfering with, or changing the value of, the current $I_{60}$ in output line 60. In this manner, the circuit of input line 20 through transducer 22 and output line 60 is effectively isolated from the others so that the current $I_{60}$ fed to the op-amp 62 is an accurate representation of the external pressure or force applied to transducer 22 only. Thus, the output voltage $V_{69}$ is an accurate measure of the force or pressure on transducer 22.

The grid circuit condition described above, with switch device 21 closed to source S, the switch devices 31, 41, 51 closed to ground G, the switch device 67 closed to the A/D converter 112, and the switch devices 77, 87, 97 open, is held just long enough to get an accurate measurement of output voltage $V_{69}$ from op-amp 62. This data is converted in the computer 100 to pressure or force units and stored in memory along with the data of the time and of the grid location of transducer 22 from where the force or pressure was measured.

Then, the timer 108 causes multiplexer 104 to close switch device 21 to ground and to close switch device 31 to source S. Switch devices 41, 51 are still held to ground G, and switch device 67 remains closed while switch devices 77, 87, 97 are held open. In this condition, the current $I_{60}$ flows through input line 30, transducer 32, and output line 60 to the op-amp 62. Therefore, the output voltage $V_{69}$ is a measurement of the external pressure or force applied on transducer 32. This data is also measured and stored in the computer 100 along with time and transducer location data.

Next, the timer 108 causes multiplexer 104 to connect switch device 41 to source S and switch devices 21, 31, 51 to ground G. In this current condition, $I_{60}$ flows through input line 40 through transducer 42 and output line 60 and is a function of the pressure or force on transducer 42. Thus, the output voltage $V_{69}$ is a measure of the force or pressure on transducer 42. After this measurement is taken and stored with time and location data in computer 100, the multiplexer 104 closes switch device 51 to source S and switch devices 21, 31, 41 to ground G. In this condition, $V_{69}$ is measured for pressure or force on transducer 52 and is stored along with time and location data in computer 100.

During the above-described sweep of input lines 20, 30, 40, 50, thus of the pressures or forces on transducers 22, 32, 42, 52, the counter 110 has counted the output pulses of timer 108, thus the switches of multiplexer 104. Therefore, after this sweep is complete, the counter 110 causes the multiplexer 106 to open switch device 67 and close switch device 77 and to reset both timer 108 and multiplexer 104. Then, the timer 108 starts over and causes multiplexer 104 to sweep through switch devices 21, 31, 41, 51 again, as described above, to feed current sequentially into input lines 20, 30, 40, 50. However, since switch device 77 is now closed instead of switch device 67, the output current will flow through output lead 70 to op-amp 72. Thus, this current $I_{70}$ is transmitted to op-amp 72 sequentially through transducers 24, 34, 44, 54 as the multiplexer 104 sweeps switch devices 21, 31, 41, 51, and is a function of the respective pressures or forces on the transducers 24, 34, 44, 54 in the same manner as described above for transducers 22, 32, 42, 52. Therefore, as multiplexer 104 sweeps switch devices 21, 31, 41, 51, the output voltage $V_{79}$ from op-amp 72 is measured sequentially for the magnitudes of external pressures or forces on transducers 24, 34, 44, 54 and stored in computer 100 along with respective time and location data.

Next, the counter 110 causes multiplexer 106 to open switch device 77 and close switch device 87, and it causes timer 108 and multiplexer 104 to reset again. Then, as the timer 108 and multiplexer 104 sweep the switches 21, 31, 41, 51 again, the current $I_{80}$ to op-amp 82 is transmitted from input lines 20, 30, 40, 50 sequentially to output line 80 through respective transducers 26, 36, 46, 56. Thus, the sequential output voltages $V_{89}$ from op-amp 82 are measures of the external pressures or forces on transducers 26, 36, 46, 56, respectively. This data of forces or pressures on transducers 26, 36, 46, 56 is taken and stored in computer 100 along with respective time and location data.

Finally, the counter 110 causes multiplexer 106 to open switch device 87 to open and switch device 97 to close, and it resets the timer and multiplexer 104. Therefore, as the timer 108 causes the multiplexer 104 to sweep switch devices 21, 31, 41, 51 again, the current $I_{90}$ flows sequentially through the transducers 28, 38, 48, 58. Thus, the sequential measurements of output voltage $V_{99}$ is indicative of the external pressures or forces applied respectively to transducers 28, 38, 48, 58. When this data of pressure or forces on transducers 28, 38, 48, 58 has been taken and stored along with corresponding time and location data in computer 100, a complete sweep of all the transducer locations in the entire grid 12 is complete. Therefore, the pressures or forces on the transducer locations over the entire surface area of the grid 12 within the time interval required for this total sweep are known and recorded along with their corresponding locations and points of time when the measurements were taken.

A reset counter 118 can keep track of the times the multiplexer 106 is activated by counter 110 to change switch devices 67,77,87,97. When one complete sweep of these switch devices 67,77,87,97 is complete, the reset counter 118 can cause multiplexer 106 to reset to open switch device 97 and close switch device 67 in order to be ready to start a new sweep. Therefore, this tactile sensing system 10 according to this invention can repeat the sweeps of the entire grid 12 continuously, or, with appropriate controls, it can be set to sweep the grid at predetermined intervals or random intervals as desired.

Of course, while the method of this embodiment 10 has been described as sweeping the switch devices 67,77,87,97, this invention can also operate under the same principle by sweeping the switch devices 67,77,87,97 for every setting of switch devices 21,31,41,51. Also, the scans can be carried out in either the X-Y or Y-X directions. The scan can also be done in a zig-zag manner across the grid in any sequence or even in a random manner. In fact, the computer can be used to control the multiplexer directly to scan or read the "most important" transducers, i.e., the ones that have shown pressure recently, more often than the transducers that have not shown pressure as recently. Therefore, sweeping outputs for each input, sweeping inputs for each output, or random as well as selected scanning or sweeping are all considered to be functional equivalents according to this invention.

Also, as mentioned above, while this invention was described with a grid having four input lines 20,30,40,50, four output lines 60,70,80,90, and sixteen transducers, the same principles apply to both larger and smaller grids. In fact, it is contemplated that many practical applications may require grids with as many as 10,000 transducers, for example at the intersections of 100 input lines with 100 output lines.

Figure 2:
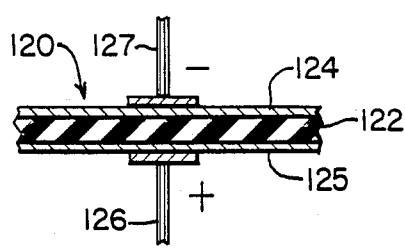
FIG. 2 is a cross section of an analog pressure transducer embodiment that can be used with this invention.
Figure 3:
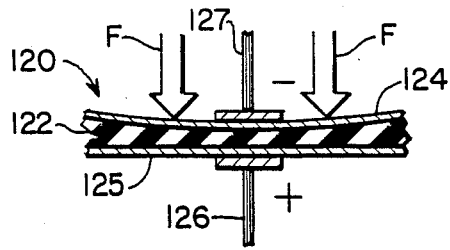
FIG. 3 is a cross section of the transducer of FIG. 2 illustrated with a pressure or force applied.

Having now described the basic components and method of the embodiment 10 in FIG. 1, there are several examples of appropriate transducer structures that could be used for the transducers 22,32,42,52,24,34,44,54,26,36,46,56,28,38,48,58 of this invention. The transducer 120 shown in FIG. 2 is one such embodiment. It is comprised of a compressible conductive or semiconductive foam material 122 in which the resistance of the foam decreases as it is compressed. This semiconductive foam 122 is sandwiched between two rigid or semi-rigid ohmic contact plates 124,125, with positive and negative leads 126,127 connected to respective opposite ones of the plates 124,125. As external forces F are applied to the top plate 124, as shown in FIG. 3, the semiducive foam 122 is compressed, thus decreasing resistance and increasing conductance through the foam 122 between the positive and negative leads 126,127. Therefore, the heavier the forces F, the less resistance the transducer 120 will have.

Such conductive foam material 122 could be a graphite material cast in a rubbery base, which is known and not a part of this invention apart from its application as described above. There is also continuous work ongoing in the industry to develop other materials that could be used in this application.

Figure 4:
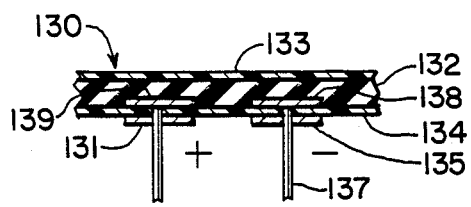
FIG. 4 is a cross section of an alternate transducer embodiment similar to that shown in FIG. 2, but with the electric leads on one side only.
Figure 5:
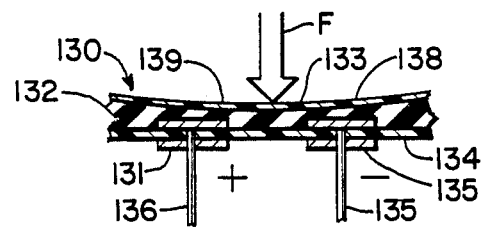
FIG. 5 is the alternate embodiment transducer of FIG. 4 illustrated with a pressure or force applied.

The transducer embodiment 130 shown in FIGS. 4 and 5 is similar to the transducer embodiment 120 shown in FIGS. 2 and 3, except that both the positive and negative electrodes are mounted on the same side of the transducer 130. This configuration has advantages, such as where it is desired to keep all wires on one side of a tactile sensing mat or blanket. In this embodiment 130, the compressible foam 132 is sandwiched between two rigid or semi-rigid nonmetallic plates 133,134. The positive lead 136 extends through the plate 134 and terminates at an electrode 139. Similarly, the negative lead 137 extends through plate 134 and terminates in electrode 138 a spaced distance apart from the electrode 139 of the positive lead. Retainers 131, 135 hold the respective leads 136,137 in position. In this embodiment 130, the compressible foam 132, like the compressible foam 122 in the embodiment shown in FIGS. 2 and 3, decreases in resistivity and increases in conductivity as it is compressed. Therefore, when an external load or force F is applied, as shown in FIG. 5, the foam 132 is compressed, reducing the resistivity and increasing the conductivity of the foam between the positive and negative electrodes 139,138, respectively.

Figure 6:
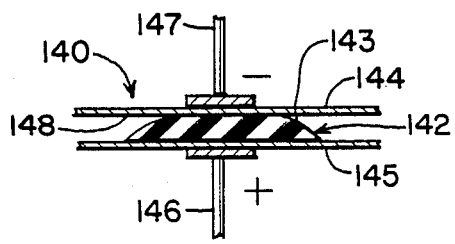
FIG. 6 is a cross section of another alternate transducer embodiment that can be used with this invention.
Figure 7:
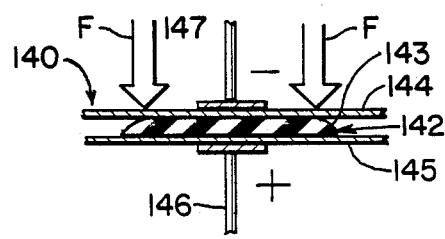
FIG. 7 is a cross section of the transducer of FIG. 6 illustrated with a pressure or force applied.

The transducer embodiment 140 illustrated in FIGS. 6 and 7 is also similar to the transducers 120,130, described above in that it also utilizes a semiconductive compressible foam in which the resistivity of the foam decreases and conductivity increases as the foam is compressed. In this transducer embodiment 140, the compressible foam 142 is positioned between two metallic plates 144,145. The positive electrode lead 146 is connected to the metallic plate 145, and the negative lead 147 is connected to the metallic plate 144. The compressible foam 142 has a rounded surface 143 extending upwardly from plate 145 into contact at a smaller area with the inside surface 148 of plate 144. As an external pressure or force F is applied to the upper plate 144, as shown in FIG. 7, not only does the foam 142 compress to decrease resistivity, but also the contact surface area between the foam surface 143 and the plate surface 148 is increased substantially. Therefore, in addition to increasing conductivity because of the nature of the compressed foam itself, conductivity is also increased and resistivity decreased due to the increased contact surface area.

Figure 8:
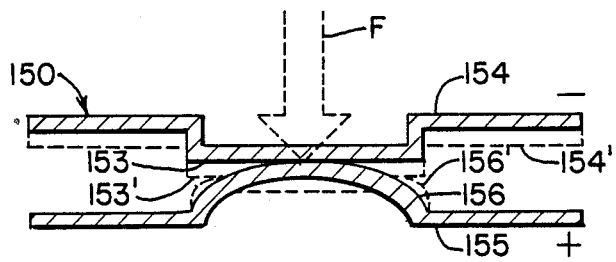
FIG. 8 is a cross section of still another alternate transducer embodiment that can be used with this invention, with the applied pressure or force and the resulting deformed transducer configuration shown in broken lines.

The transducer embodiment 150 shown in FIG. 8 is somewhat similar to the embodiment 140 of FIG. 6, except that the contacting plates 154,155 constitute the negative and positive electrodes themselves. In this embodiment, these plate electrodes 154,155, are preferably thin, resilient metal strips. The upper metal strip 154 has a downwardly projecting surface 153 that is essentially flat. The lower plate 155 has a rounded upwardly projecting surface 156 that extends toward and contacts the surface 153 of plate 154. In the normal position, since surface 156 is rounded and surface 153 is flat, the area of contact 157 is very small. However, when an external pressure or force F is applied to the upper plate electrode 154, causing it to be pressed downwardly as indicated in broken lines 154', the rounded surface 156 of electrode 155 is forced to flatten out as indicated by broken lines 156'. As a result, the contact area between the flattened surface 156' and the downwardly depressed surface 153' increases substantially, thereby decreasing the resistivity and increasing the conductivity between the electrodes 154,155.

Figure 9:
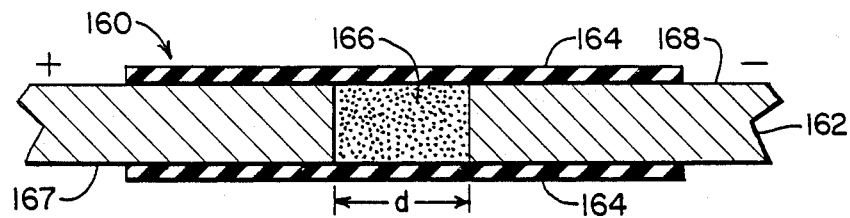
FIG. 9 is a cross section of yet another transducer embodiment that can function with the present invention in a tensile mode.
Figure 10:
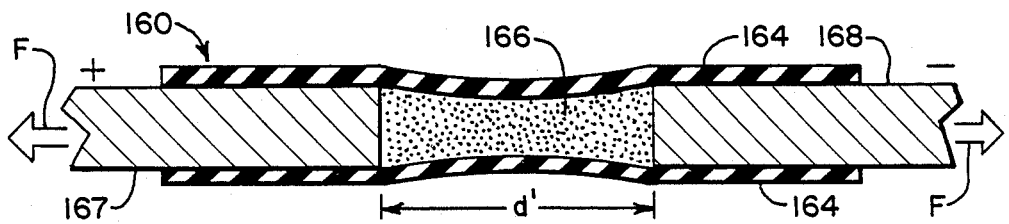
FIG. 10 is a cross section of the transducer embodiment of FIG. 9 shown with tensile forces applied thereto.

The transducer embodiment 160 shown in FIGS. 9 and 10 is more suited for situations in which the external force is tensile rather than compressive. In this embodiment, a metallic positive electrode 167 and a metallic negative electrode 168 are inserted and retained in opposite ends of a resilient, nonconductive sleeve 164. The space in the sleeve 164 between the electrodes 167,168 is filled with a semiconductive fluid 166. In this embodiment 160, the resistivity of the fluid increases and the conductivity decreases as a function of increasing distance between the electrodes 167,168. Therefore, when an external tensile force F is applied to the electrodes 167,168, as shown in FIG. 10, the resilient sleeve 164 stretches so that the distance d' between the electrodes 167,168 increases. The increased distance d' of the semiconductive fluid 166, as mentioned above, increases the resistance and decreases the conductivity between the electrodes 167,168.

Figure 11:
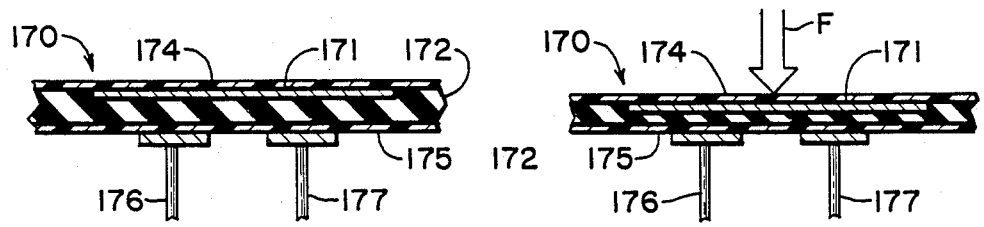
FIG. 11 is a cross section of a capacitive-type transducer embodiment that can be used with the present invention with only minor variations.
Figure 12:
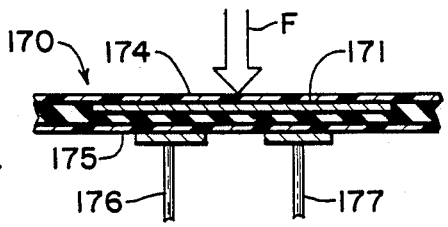
FIG. 12 is a cross section of the transducer of FIG. 11 shown with a pressure or force applied thereto.

The transducer embodiment 170 shown in FIGS. 11 and 12 is a capacitance transducer instead of a resistance transducer. Therefore, this capacitance transducer 170 may be more appropriate for use with an alternating input current. In this embodiment 170, a nonconductive compressive foam 172 is sandwiched between two rigid or semi-rigid nonmetallic, non-conductive plates 174,175. The two electrodes 176,177 are positioned in spaced apart relation to each other against one of the non-conductive plates 175. A conductive plate 171 is positioned under the opposite non-conductive plate 174 and opposite the electrodes 176,177 with the compressive foam 172 positioned between the conductive metallic plate 171 and the electrodes 176,177. When an external force F is applied to the plate 174, as shown in FIG. 12, the foam 172 is compressed, thereby allowing the metallic plate 171 to approach closer to the electrodes 176,177. As the conductive metallic plate 171 approaches closer to the electrodes 176,177, the capacitance between the electrodes 176,177 decreases.

A tactile sensing system utilizing capacitive transducers, such as that shown in FIGS. 11 and 12, has several advantages, in addition to being functional with alternating current. For example, it could also be driven simply with a pulse. Also, since this transducer embodiment relies on capacitance between metallic plates and electrodes instead of changing resistivity of a compressible foam, it is not as susceptible to contaminants over long periods of use. Further, like the embodiment shown in FIGS. 4 and 5, this capacitance transducer embodiment 170 is more conducive for use on a single-sided system wherein all the electrical conductors are preferred to be positioned on the bottom while the top surface has the external force or pressures applied thereto. It is also appropriate to mention that this capacitance transducer embodiment could be varied to provide a shield that is pressed closer to the electrodes by the external force F, which would change the capacitance in the opposite direction by increasing capacitance between the electrodes 176,177 instead of decreasing the capacitance.

This invention also encompasses other specific methods and grid apparatus to accomplish the same result as the grid 12 described above. For example, instead of the variable resistive or variable capacitive transducers at grid crossing points to pass current directly from the input lines to the perpendicular output lines, separate circuits and activating means can be utilized, in some circumstances to greater advantage than the straight electronic grid circuit 12 of FIG. 1.

Figure 13:
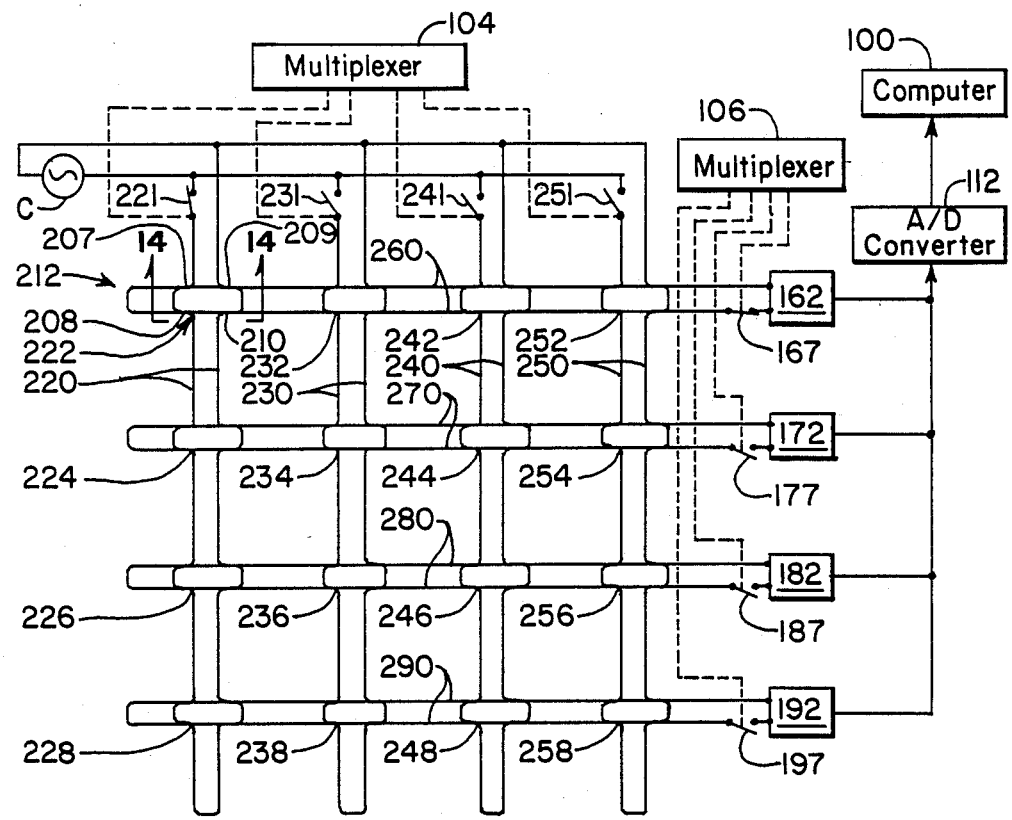
FIG. 13 is a partial schematic diagram of the tactilitic sensor system according to the present invention utilizing induced electromagnetic transducers.

The grid 212 in FIG. 13 illustrates in schematic an electromagnetic embodiment of this invention. In this electromagnetic grid 212, the input lines are in the form of looped conductors 220,230,240,250. The output lines are in the form of looped conductors 260,270,280,290, which are positioned substantially perpendicular and in close, non-contacting proximity to the input looped conductors 220,230,240,250. Transducers 222,232,242,252 are positioned at the near intersections of looped conductor 260 with looped conductors 220,230,240,250, respectively. Likewise, transducers 224,334,244,254 are positioned at the near intersections of looped conductor 270 with looped conductors 220,230,240,250, respectively. Transducers 226,236,246,256 are positioed at the near intersections of looped conductor 280 with looped conductors 220,230,240,250, respectively, and transducers 228,238,248,258 are positioned at the near intersections of looped conductor 290 with looped conductor 220,230,240,250, respectively.

Figure 14:
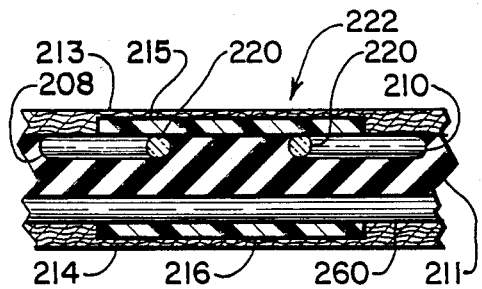
FIG. 14 is a cross section of an electromagnetic transducer taken along lines 14—14 of FIG. 13.

A suitable transducer device 222, which can be typical of all the transducers in this grid 212, is shown in cross section in FIG. 14. It is comprised of the input looped conductor 220 separated spacially from the output looped conductor 260 by a compressible, conductive and nonmagnetic foam material 211. The input conductor 220 is bent, as shown in FIGS. 13 and 14, to have sections 207,208,209,210 run parallel to the output conductor 260. Therefore, a magnetic field caused by alternating current or by a pulse in input conductor loop 220 can induce a current and voltage in output conductor loop 260.

Figure 15:
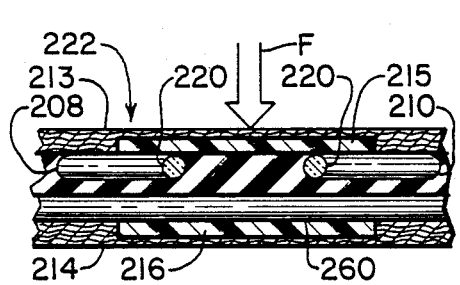
FIG. 15 is a cross section of the electromagnetic transducer of FIG. 14 shown with a pressure or force applied thereto.

This assembly of conductors 220,260 and foam material 211 is illustrated as being covered both over and under by fabric sheets 213,214, such as for use in a bed mat structure. Therefore, in order to maintain some rigidity for accurate measurement and to protect the conductors 220,260, two rigid or semi-rigid, nonconductive backing plates 215,216 are positioned respectively over conductor 220 and under conductor 260. Therefore, when an external pressure or force F is applied on the transducer 222, as shown in FIG. 15, the backing plates 215,216 tend to compress the foam 211 uniformly in the vicinity of the conductors 220,260 and to move the conductors 220 uniformly toward the conductors 260.

As the force F pushes the conductors 220,260 closer together, the induced voltage in output conductor loop 260 decreases. In other words, the output voltage on conductor loop 260 varies inversely with the magnitude of the force F applied to the transducer 222.

Switch devices 221,231,241,251 connect respective looped input conductors 220,230,240,250 to an a.c., pulse, or function generator source C. These switch devices can be controlled to operate in a timed sequence by a multiplexer device 104, in much the same manner as that described above for the embodiment 10 of FIG. 1. Therefore, for purposes of brevity, the timer, counter, resets, and the like, will not be described or illustrated again here.

When the multiplexer device 104 causes switch device 221 to close to the source C and the remaining switch devices 231,241,251 to remain open, the alternating current or pulse in input looped conductor 220 creates a magnetic field around the conductor 220. This magnetic field can induce an alternating current or pulse, thus induced voltage, in the nearly intersecting output looped conductors 260,270,280,290 through the transducers 222,224,226,228, as described above. These induced voltages can be amplified by voltage amplifiers 162,172,182,192, respectively, converted to digital form by A/D converter 112, and fed to computer 100 for processing and storage along with time and location data in the same manner as described above for the embodiment 10 in FIG. 1. As also described above for embodiment 10, the multiplexer device 106 can control switch devices 167,177,187,197 in timed sequence to isolate and read the voltage output of only one of the output looped conductors 160,170,180,190 at a time.

Another embodiment 310 of the tactile sensing system of the present invention is shown in FIG. 16. In this embodiment 310, a grid 312 is utilized in substantially the same manner as the grid 12 described above for the tactilitic sensing embodiment 10. However, its operative components are different. The input to this grid 312 is provided by electroluminescent strips 320,330,340,350. Such electroluminescent strips produce light along their entire lengths when connected to, and driven by, an alternating current source or by pulse. Such electroluminescent strip devices are known in the electronics art.

As utilized in this invention, the input to the grid 312 is provided through the electroluminescent strips 320, 330, 340,350. The transducers 322,324,326,328,332,334,336,338,342,344,346,348,352,354,356,358 receive light from the respective electroluminescent strips 320,330, 340,350, and convert the light to an electric current. The output of the grid, therefore, is provided by output circuits 360,370,380,390, which can be measured in the same manner as described above for the preferred embodiment 10.

As shown in FIG. 16, the input electroluminescent strip 320 has a pair of leads 321, 323 which can be connected to an electric source, such as an alternating current, function generator, or pulse generator. (not shown). Likewise, the electroluminescent input strip 330 can be connected by leads 331,333 to the electric source, electroluminescent strip 340 can be connected by leads 341,343 to the electric source, and electroluminescent input strip 350 can be connected by leads 351,353 to the electric source. Also, switch devices (not shown) can be connected to respective leads 321, 331,341,351, and used in the same manner as the input switches 21,31, 41,51 of the embodiment 10 described above. Since such switch devices, electric power sources, multiplexer driving devices, and the like have already been described above for the embodiment 10, and since such devices can be applied to the embodiment 310 shown in FIG. 16 in the same manner as that described above, it is not considered necessary to repeat the description and functions of those devices again in describing this embodiment. Also, as will become more apparent as the description of this embodiment 310 proceeds, the output circuit from this grid 312 on output circuits 360,370,380,390 are in the form of current flowing in the respective circuit conductors, 361,363,371,373,381,383,391,393. Therefore, essentially the same current to voltage converting op-amps 62, 72,82,92 and switching devices 67,77,87,97 as described above for the embodiment 10 can be utilized for collecting output data from the output circuits 360,370,380,390 of the grid 312 shown in FIG. 16. Therefore, it would be repetitious and is not considered necessary to illustrate those components again in describing this embodiment 310.

In this embodiment 310 illustrated in FIG. 16, when the electroluminescent input strip 320 is connected by a switch device (not shown) to a power source (not shown), it produces light along its entire length. The transducers 322,324,326,328 are distributed and positioned at desired locations along the length of the electroluminescent strip 320. A transducer 322, which can be typical of all of the transducers in this embodiment, is shown in more detail in FIG. 17. The electroluminescent strip 320 and a photovoltaic cell 300 are held a spaced distance apart from each other by a compressible foam material 311. An open space 306 between the photovoltaic cell 300 and the electroluminescent strip 320 is interrupted by a mask 304 having a plurality of holes 305 therethrough. A spacer 315 positioned between the mask 304 and the electroluminescent strip 320 maintains a constant space or distance between the mask 304 and the electroluminescent strip 320. The transducer is enclosed on the top and the bottom by respective fabric sheets 313,314.

Figures 17, 18:
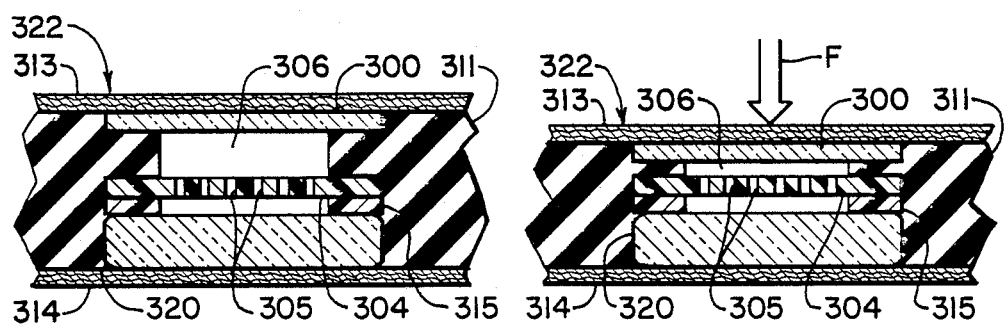
FIG. 17 is a cross section of a photoelectric transducer according to the present invention taken along lines 17—17 of FIG. 16.
FIG. 18 is a cross section of the photoelectric transducer of FIG. 17 shown with a force or pressure applied thereto.

In operation, light produced by the electroluminescent strip 320 passes through the holes 305 in mask 304 and through the open space 306 to be incident on the photovoltaic cell 300. Therefore, the photovoltaic cell 300 produces an electric current, which is connected to the leads 361,363 of output circuit 360, as shown in FIG. 16. Then, as illustrated in FIG. 18, when an external pressure or force F is applied to the transducer 322, the foam 311 compresses and allows the photovoltaic cell 300 to move closer to the mask 304. Since the light incident on the photovoltaic device 300 varies inversely with the square of the distance between the mask and the photovoltaic device, the current output of the current photovoltaic device increases as the distance in the open space 306 between the mask 304 and the photovoltaic device 300 decreases. Therefore, the output current in output circuit 360 of FIG. 16 increases as the pressure or force F on the transducer 322 increases. This increasing current in output circuit 316 can be detected and processed in the same manner as that described above for the current $I_{60}$ in the conductor 60 of embodiment 10.

Therefore, utilizing essentially the same components and techniques described above for the embodiment 10 to provide input to the grid and acquire output data from the grid, this embodiment shown in FIG. 16 can function in much the same manner for tactile sensing systems as that described in the embodiment 10 above. More specifically, when the electroluminescent input strip 320 is powered, as described above, while the remaining electroluminescent input strips 330,340,350 are not powered, and with the output data being taken and measured only from output circuit 360, only the pressure or force applied to transducer 322 is measured. Then, input strip 320 can be switched off and input strip 330 can be switched on so that the transducer 332 provides the output current on circuit 360, thus providing output data indicative of the force or pressure, if any, applied to transducer 332. Next, input strip 340 is switched on while the remaining input strips 320,330,350 are switched off to provide output data from transducer 342. After that, input strip 350 is switched on and input strip 340 is switched off so that the output data on circuit 360 is indicative of the external force or pressure applied to transducer 352. Then, in the same manner as described for embodiment 10 above, the sequence continues to take output data from circuit 370 while input is sequentially switched through input strips 320,330,340,350, respectively. Thus the output data in that sequence is indicative of the individual forces or pressures applied to tranducers 324,334,344,354, respectively. In a like manner, the sequencing devices continue to sweep to read to produce output data from transducers 326,336,346,356 and then from transducers 328, 338,348,358. When the entire grid 312 has been swept in the manner described above for obtaining output data of all of the external forces or pressures applied to all of the transducers, the sweep cycle can be started over either immediately or at preset or random intermittent intervals.

An alternate transducer embodiment for the grid 312 is shown in FIGS. 19 and 20. In this alternate transducer embodiment 1322, the foam structure 1311 enclosed on the top and bottom by fabric sheets 1313, 1314, respectively, is essentially the same as in the transducer 322 shown in FIG. 17 and described above. However, the photovoltaic cell 1300 in transducer 1322 is positioned adjacent the electroluminescent strip 320 with an opaque partition 1307 of the foam material 1311 positioned between the electroluminescent strip 320 and the photovoltaic cell 1300. A mirror 1308 is positioned a spaced distance above the electroluminescent strip 320 and photovoltaic cell 1300 with an open space 1306 therebetween. Consequently, light produced by the electroluminescent strip 320 can only be incident on the photovoltaic cell 1300 by passing through the open space 1306 to mirror 1308, where it is reflected toward photovoltaic cell 1300. Therefore, in this embodiment, light produced by the electroluminescent strip 320 and incident on the photovoltaic device 1300 also varies inversely to the square of the distance between the mirror 1308 and the photovoltaic device 1300. Consequently, when an external pressure or force F is applied to the transducer 1322, as illustrated in FIG. 20, the foam 1311 compresses allowing the mirror 1308 to move closer to the photovoltaic cell 1300. As a result, the intensity of the light incident on the photovoltaic cell 1300 increases as the force or pressure F increases, and the output current from the photovoltaic cell 1300 increases as the force F increases. This transducer embodiment 1322 therefore can be used in the grid 312 of FIG. 16 in the same manner as the transducer embodiment 322 described above.

While the electroluminescent input strips 320,330,340,350 provide a very practical light source for the input parts of the grid 312, other light sources could also be used. For example, fiber optic bundles could be used in place of the electroluminescent input strips 320,330,340,350 to transmit light to the transducers. The bundles could include one or more fibers terminating at each of the tranducers. For example, the input electroluminescent strip 320 could be replaced by a bundle of four optical fibers, each emanating from a common light input terminal but extending to respective ones of the transducers 322, 324,326,328. Similar bundles of four optical fibers could be used in place of the electroluminescent input strips 330,340,350, to transmit light to the respective transducers on those input lines. Then, the light source could be one light emanating diode (LED) at each input terminal. The multiplexer and drivers could then be used to turn the LED's on and off sequentially in the same manner as the electroluminescent input strips shown in FIG. 16 are turned on and off sequentially.

Another way of providing light ot the transducers in the grid 312 of FIG. 16 in place of the electroluminescent input strips 320,330,340,350 is to provide a separate LED at each transducer location. Each such LED on a common input line of the grid, powered by a common circuit and turned off and on as a group. For example, a separate LED could be provided for each of the transducers 322,324,326,328, with each of these LED's being powered by a common electrical circuit and switched on and off by a common switch. Likewise, the electroluminescent strip 330 could be replaced by four LED's on a common power circuit, with each LED placed respectively at the transducer locations 332,334,336,338. This same structure of grouped or ganged LED's could also replace the electroluminescent input strips 340,350 to complete the grid. Such a grid structure with the input lines of the grid provided by ganged or grouped LED's would function essentially the same as the grid 312 shown in FIG. 16 and described above.

Figure 21:
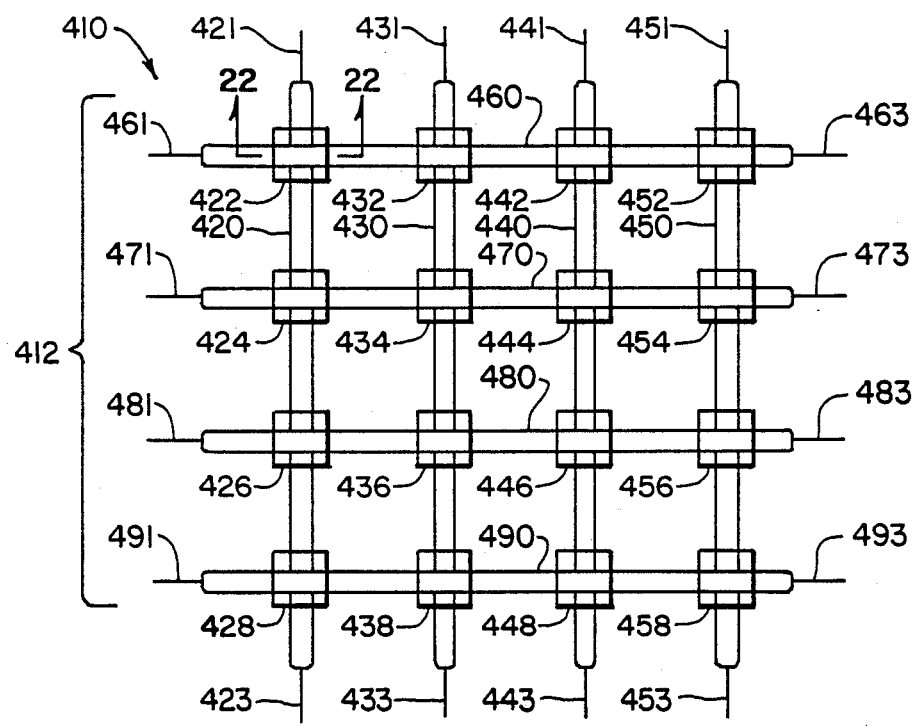
FIG. 21 is a partial schematic diagram of a tactilitic sensor according to the present invention that utilizes optical fiber transducers.

Another tactile sensing embodiment 410 according to the present invention is shown in FIG. 21. This embodiment 410 has a grid 412 that is similar to the grid 312 shown in FIG. 16 and described above to the extent that elongated electroluminescent strips 420,430,440,450 provide the input signals to the grid 412. However, the output signals of the grid 412 are in the form of elongated photoconductors 460,470,480,490. These elongated photoconductors 460,470,480,490 are strips in which current is induced by light incident thereon, so that the output through leads 461,463 of strip 460, leads 471,473 of strip 470, leads 481,483 of strip 480, and leads 491, 493 of strip 490, respectively is in the form of a DC current. Such elongated photoconductors are known. For example, some electroluminescent strips, such as those contemplated for use as input strips 420,430,440,450, which produce light upon the application of electric power also can be made to produce electric current by the application of light thereto.

Figures 22, 23:
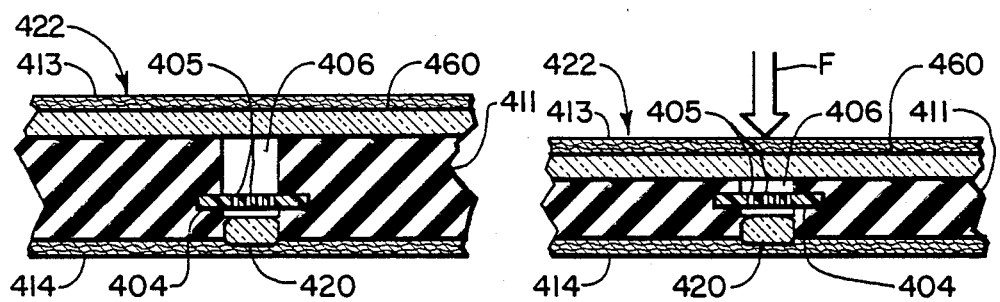
FIG. 22 is a cross section of a fiber optic transducer taken along lines 22—22 of FIG. 21.
FIG. 23 is a cross section of the fiber optic transducer shown in FIG. 22 with a force or pressure applied thereto.

Therefore, in the embodiment shown in FIG. 21, when electroluminescent input strip 420 is powered through leads 421,423, the light produced thereby can be made incident on output photoconductor strips 460,470,480,490 through respective transducers 422,424,426,428. Likewise, the electroluminescent strip 430, when powered through leads 431,433 can produce light incident on output photoconductor strips 460, 470,480,490 through respective transducers 432,434,436,438. Input strip 440 when powered through leads 441,443 can produce light incident on output strips 460, 470, 480, 490 through transducers 442, 444, 446, 448, respectively, and input strip 450 can produce light incident on output strips 460, 470, 480, 490 through respective transducers 452, 454, 456, 458. A transducer 422, typical of all of the transducers in FIG. 21, is shown in more detail in FIG. 22. This transducer 422 is similar to the transducer 322 shown in FIG. 17 and described above, except that the photovoltaic cell 300 in transducer 322 is replaced by the elongated photoconductor strip 460. Otherwise, the electroluminescent input strip 420 separated from the elongated photoconductor strip 460 are separated in a similar manner by a compressible foam 411 and covered by top and bottom fabric sheets 413, 414, respectively. Also, the open space 406 between electroluminescent input strip 420 and photoconductor output strip 460 is interrupted by a mask 404 with a plurality of holes 405 extending therethrough. When an external pressure or force F is applied to the transducer 422, as shown in FIG. 23, the foam material 411 compresses, allowing the force F to move the elongated output photoconductor 460 closer to the mask 404. Since the light incident on the photoconductor 460 varies in inverse relation to the square of the distance between the photoconductor 460 and the mask 404, the current produced by the output photoconductor 460 increases as a function of the force F applied to the transducer 422.

Again, since the electroluminescent input strips 420, 430, 440, 450 can be switched on and off in sequence, and since the induced output on leads 463, 473, 483, 493 is in the form of a DC current, the same input sequence switching and control devices and the same output data collecting devices as described above for embodiment 10 can be used to operate the grid 412 shown in FIG. 21 and to collect output data therefrom.

Another tactile sensing embodiment 510 according to the present invention utilizes a grid 512 of optical input fibers 520, 530, 540 crossed with optical output fibers 560, 570, 580. This embodiment 512 utilizes a characteristic of optical fibers in which light from one optical fiber can be transferred to another optical fiber by contact of there respective external surfaces.

Figure 24:
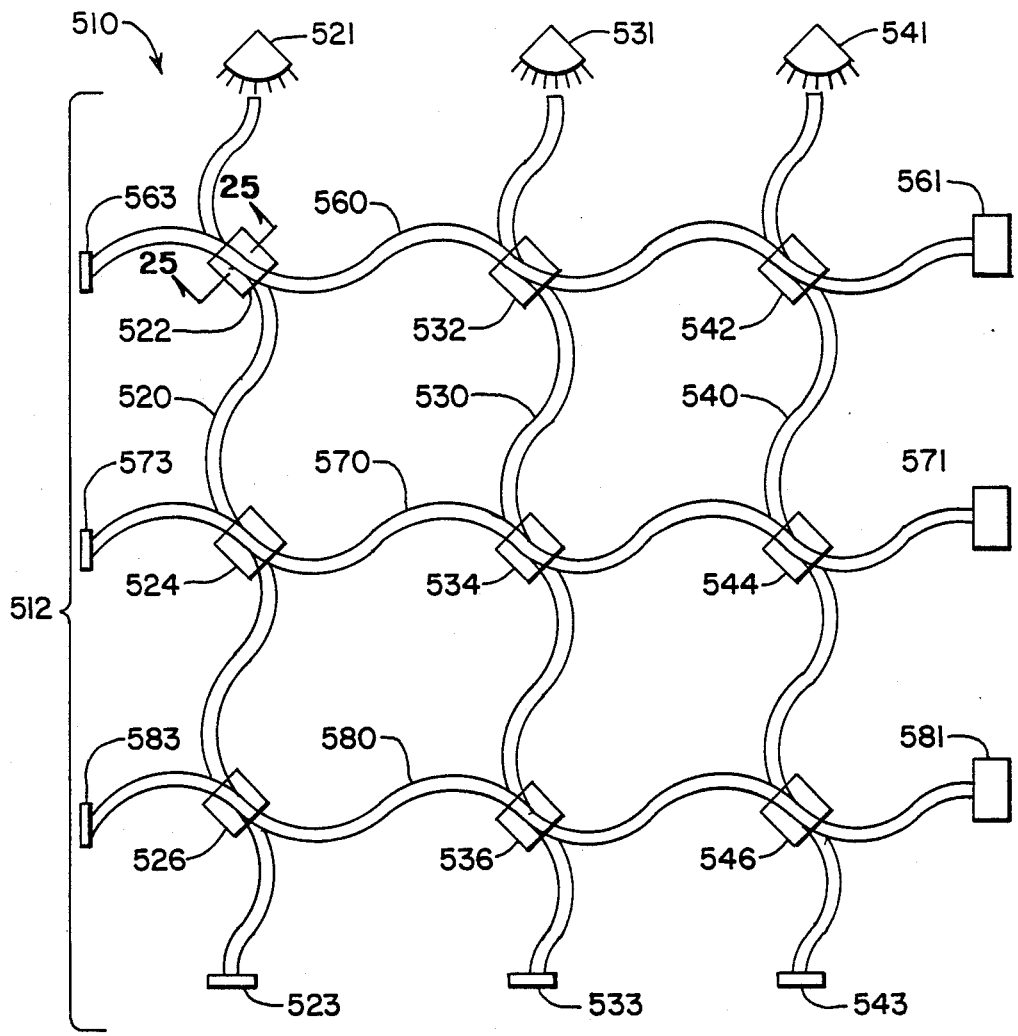
FIG. 24 is a partial schematic diagram of an alternate optical fiber tactilitic sensor system according to the present invention.

The grid 512, is illustrated in FIG. 24 with three input fibers 520, 530, 540 and with three output fibers 560, 570, 580. Input fiber 520 has a light source 521, such as a LED, at one end and an opaque cap 523 at the other end. Likewise, input fiber 530 has a light source 531 at one end and an opaque cap 533 at the other end and input fiber 540 has a light source 541 at one end and an opaque cap 543 at the other end. Output fiber 560 has an opaque cap 563 at one end and a photovoltaic cell 561 at the other end. Likewise, output fiber 570 has an opaque cap 573 at one end and a photovoltaic cell 571 at the other end, and output fiber 580 has an opaque cap 583 at one end and a photovoltaic cell 581 at the other end.

A characteristic of conventional optical fibers that must be considered in this embodiment 510 is that light can usually transfer between adjacent optical fibers that are in contact with each other when their orientation is parallel to each other, but that light does not transfer readily between optical fibers that are perpendicular to each other. Therefore, the input and output optical fibers shown in FIG. 24 are curved in such a way that the input and output fibers lay parallel to each other for at least a short distance at their intersecting locations. Therefore, light in the input fiber 520 produced by the source 521 can be transferred into any one of the output fibers 560, 570, 580 through transducer locations 522, 524, 526, respectively. Likewise, light in input fiber 530 produced by light source 531 can be transferred to any one of the output fibers 560, 570, 580 through transducers 532, 534, 536, respectively. Also, light in input fiber 540 from light source 541 can be transferred to output fibers 560, 570, 580 through transducers 542, 544, 546, respectively, at their respective intersecting locations of those fibers.

Light in the output fiber 560 is transmitted by the fiber 560 to the photovoltaic cell 561, which produces a photoelectric current. Likewise, photovoltaic cell 571 produces a photocurrent from light in fiber 570, and photovoltaic cell 581 produces a photocurrent from light in fiber 580. The photocurrents produced by the photovoltaic cells 561, 571, 581, vary as a function of the light intensity in the respective output fibers 560, 570, 580. The transducers 522, 524, 526, 532, 534, 536, 542, 544, 546, vary the amount of light transferred from the respective input fibers 520, 530, 540 to the respective output fibers 560, 570, 580 as a function of the external pressures or forces, if any, applied to the respective transducer locations.

Figure 25:
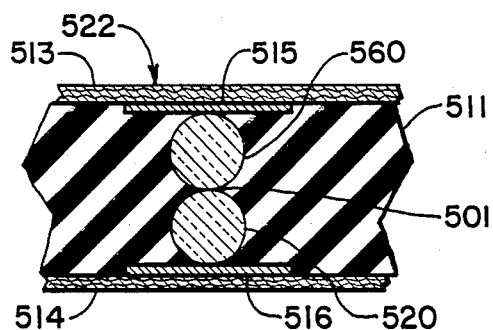
FIG. 25 is a cross section of the optical fiber transducer taken along lines 25—25 of FIG. 24.

A transducer 522, which is typical of the other transducers in this grid 512, is shown in more detail in FIG. 25. Essentially, this transducer 522 is comprised of the input optical fiber 520 positioned in parallel contact with the output transducer 560. A rigid or semi-rigid plate 515 is positioned over the output fiber 560, and a similar rigid or semi-rigid plate 516 is positioned under the input fiber 520. The optical fibers 520, 560 and the plates 515, 516 are enclosed in a compressible foam material 511. The plates 515, 516 provide additional structural rigidity and support to the optical fibers 560, 520, respectively, and the transducer assembly is covered on the top by a fabric sheet 513 and on the bottom by a similar fabric sheet 514.

Figure 26:
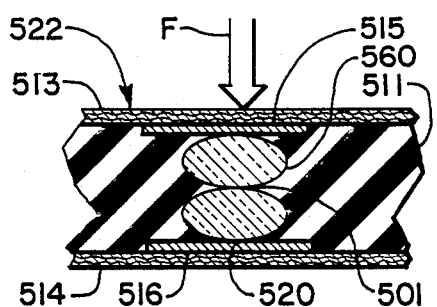
FIG. 26 is a cross sectional view of the fiber optic transducer of FIG. 25 shown with a force or pressure applied thereto.

In the structure shown in FIG. 25 with no external force or pressure applied to the transducer 522, the contact area between the two optical fibers 520, 560, which are both circular in cross section is minimal. Thus only a minimal amount of light, if any, can transfer from input fiber 520 to output fiber 560. However, when an external pressure or force F is applied to the transducer 522, as illustrated in FIG. 26, the foam material 511 compresses as the plates 515, 516 force the optical fibers 520, 560 to be compressed against each other. In this compression, the optical fibers 520, 560 deform into the oval-shaped cross sections illustrated in FIG. 26 so that the contact surface area 501 between the fibers 520, 560 increases substantially. The more force F that is applied to the transducer 522, the more the optical fibers 520, 560 deform resulting in increasing contact surface area 501. As the contacting surface area 501 increases, the amount of light that transfers from the input fiber 520 to the output fiber 560 also increases. Therefore, the amount of light that transfers from an input fiber 520 to an output fiber 560 is a function of the external force or pressure F applied to the transducer 522. Further, since the amount of current produced by the photovoltaic cell 561 varies with the amount or the intensity of the light in optical fiber 560, then the current output from photovoltaic cell 561 is a function of the pressure or force F applied to the transducer 522. Likewise, the photocurrents produced by photocells 571, 581 are functions of the forces applied to the transducers connecting input fibers of the grid to respective output fibers of the grid that are terminated at those photovoltaic cells.

Again, since the light sources 521, 531, 541 can be switched on and off in sequence, and since the photovoltaic cells 561, 571, 581 produce an output current as a function of the forces on the respective transducers, the same sequence switching methods and components and data gathering methods and components shown in FIG. 1 and described above for embodiment 10 can be used for operating the grid 512 of this embodiment 510.

The foregoing is considered as illustrative only of the principles of the invention. Further, since numerous modifications and changes will readily occur by those skilled in the art, it is not desired to limit the invention to the exact construction and operation shown and described, and accordingly, all suitable modifications and equivalents may be resorted to falling within the scope of the invention as defined by the claims which follow.

The embodiments of the invention in which an exclusive property or privilege is claimed are defined as follows:

1. Tactile sensing apparatus, comprising:
   a grid having a plurality of elongated linear input means positioned in spaced apart relation to each other over a surface area for conducting input power to selected locations on said surface area and a plurality of elongated output means positioned in spaced apart relation to each other over the surface area for conducting power from said selected locations on said surface area, said output means intersecting said input means at said selected locations;

input energy feeder means connectable to said input means for feeding energy into said input means;

output energy detection means for detecting and measuring energy in said output means;

a plurality of transducer means positioned at said intersecting locations, each transducer means being connected one of said input means and to one of said output means for transferring energy from the input means to the output means in such a manner that the amount of energy transferred by the transducer means from an input means to an output means is a function of force applied to said transducer means;

input control means connected to said input energy feeder means for causing said input energy feeder means to feed energy to only selected ones of said input means at a time; and data processing means for correlating output energy detected by said output energy detection means with said input control means for determining magnitudes and locations of forces applied to said respective transducers.

2. The tactile sensing apparatus of claim 1, wherein said linear input means include input electrical conductors, said linear output means include output electrical conductors, and said input energy feeder means includes an electric current source.

3. The tactile sensing apparatus of claim 2, wherein said transducer means includes variable resistance means in which the resistivity varies as a function of force applied to the variable resistance means, wherein said variable resistance means connects said input electrical conductor to said output electrical conductor.

4. The tactile sensing apparatus of claim 1, wherein said input control means includes input switch means connected between each of said input means and said input energy feeder means and input program means connected to said input switch means for connecting said input means one at a time sequentially to said input energy feeder means, and wherein said output energy detection means includes output switch means connected to each of said output means and output program means connected to said output switch means for connecting said output means one at a time sequentially to said output energy detection means.

5. The tactile sensing apparatus of claim 2, wherein said transducer means includes variable capacitance means in which the capacitance varies as a function of force applied to the variable capacitance means, wherein said variable capacitance means is connected between said input electrical conductor and said output electrical conductor.

6. The tactile sensing apparatus of claim 5, wherein said variable capacitance means includes two electrodes spaced apart from each other, a conductive plate positioned a spaced distance from said electrodes, and a compressible material positioned between said conductive plate and said electrodes in such a manner that a force applied on said transducer causes said material to compress and allow said conductive plate to move toward said electrodes.

7. The tactile sensing apparatus of claim 2, wherein said output energy detection means includes op-amp means connected to said output means for converting electric current in said output means to voltage output data that varies as a function of the current flowing in said output means.

8. The tactile sensing apparatus of claim 7, wherein said data processing means includes analog-to-digital converter means connected to said op-amp means for converting said voltage output data to digital form and a digital computer connected to said analog-to-digit converter means for processing, storing, and outputting force magnitude and location data.

9. The tactile sensing apparatus of claim 2, wherein said transducer means includes said input and output electrical conductors passing in close, non-contacting proximity to each other and wherein said input and output electrical conductors are movable toward and away from each other in response to a force applied on the transducer means.

10. The tactile sensing apparatus of claim 2, wherein said linear input means includes light-producing means connected to said input electrical conductors for converting electrical energy from said electric current source to light energy.

11. The tactile sensing apparatus of claim 10, wherein said linear input means includes an elongated input optical fiber that receives light from said light-producing means and transmits the light to said transducer means.

12. The tactile sensing apparatus of claim 11, wherein said linear output means includes an elongated output optical fiber, and said transducer means includes a portion of said input optical fiber that is positioned in parallel contacting relation with said output optical fiber creating a contacting surface area between said input and output optical fibers at which light is transferable from the input optical fiber to the output optical fiber in such a manner that the contacting surface area varies as a function of force applied on said transducer means, and including photovoltaic conversion means connected to said output optical fiber for converting light energy in said output optical fiber to electrical energy.

13. The tactile sensing apparatus of claim 10, wherein said transducer means includes photovoltaic conversion means for converting light energy to electrical energy and incident light control means for varying the intensity of light from said light-producing means incident on said photovoltaic conversion means as a function of a force applied on said transducer means.

14. The tactile sensing apparatus of claim 13, wherein said light control means includes said light-producing means and said photovoltaic conversion means being positioned a spaced distance apart from each other, a mask with a hole therethrough positioned in the space between said light-producing means and said photovoltaic conversion means, and yieldable resilient spacer means positioned in contact with both said light-producing means and said photovoltaic conversion means for yieldably holding said light-producing means and said photovoltaic conversion means apart.

15. The tactile sensing apparatus of claim 13, wherein said light control means includes said light-producing means and said photovoltaic conversion means positioned adjacent each other with an opaque barrier positioned between said light-producing means and said photovoltaic conversion means, reflective mirror means positioned a variable spaced distance over both said light producing means and said photovoltaic conversion means in such a manner that light produced by said light-producing means is reflected on said mirror to said photovoltaic conversion means and said mirror means is movable toward said light-producing means and said photovoltaic conversion means in response to a force applied on said transducer means.

16. The tactile sensing apparatus of claim 13, wherein said light-producing means includes an elongated electroluminescent strip capable of producing light along its entire length when connected to said electric current source.

17. The tactile sensing apparatus of claim 13, wherein said light-producing means includes a plurality of light-emitting diodes (LED's).

18. The tactile sensing apparatus of claim 13, wherein said photovoltaic conversion means includes a semiconductor photovoltaic cell device in which electric current is produced by light incident thereon.

19. The tactile sensing apparatus of claim 13, wherein said photovoltaic conversion means includes an elongated photoconductor in which electric current is produced by light incident thereon.

20. The tactile sensing apparatus of claim 3, wherein said variable resistance means includes two electrical contacts spaced apart from each other and a compressible semiconductor material positioned between said contacts, wherein the resistivity of said semiconductor material varies as a function of the extent to which the material is compressed and wherein the extent to which the material is compressed varies as a function of the magnitude of compressive force applied to the material.

21. The tactile sensing apparatus of claim 3, wherein said variable resistance means includes two electrical contacts spaced apart from each other, each of said contacts having a surface area, and a semiconductor material positioned between and in contact with said electrical contact surface areas in such a manner that the area of semiconductor material that contacts one of said electrical contacts varies as a function of force applied to the transducer means.

22. The tactile sensing apparatus of claim 3, wherein said variable resistance means includes two electrodes positioned a spaced distance apart from each other, a stretchable, resilient sleeve attached to said electrodes and enclosing the space between said electrodes, and a semiconductor fluid filling said enclosed space.

23. The tactile sensing apparatus of claim 4, wherein said input program means and said output program means are coordinated together such that energy is fed into each of said input means sequentially as energy in each of said output means is detected and measured.

24. The tactile sensing apparatus of claim 23, wherein said data processing means is connected to said input control means and to said output energy detection means for detecting and correlating which of said input means is being fed energy and on which of said output means energy is being detected and the magnitude of such energy detected and for processing such input and output data into real time measurements of forces on specific transducer locations.

25. The tactile sensing apparatus of claim 24, including display means connected to said data processing means for displaying force magnitude and location data in a manner perceptible to human senses.

26. A method of sensing and measuring forces applied on a plurality of locations on a surface area, comprising the steps of:
forming a grid of energy input and energy output devices on the surface area, which grid includes a plurality of elongated energy input devices in spaced apart relation to each other and generally oriented to run in one direction on the surface and a plurality of elongated energy output devices in spaced apart relation to each other and generally oriented to run in another direction such that the energy input divides intersect the energy output devices;
connecting the energy input devices to the energy output devices at the intersecting locations with transducers that allow energy to flow therethrough from the energy input devices to the energy output devices in amounts that vary as a function of the magnitude of forces applied on the respective transducers;
feeding energy sequentially into selected input devices while isolating the other input devices from energy input and detecting and measuring energy sequentially in selected output devices while isolating the other output devices from energy output;
correlating and processing data indicating the input device to which energy is being fed with data indicating the output device from which energy is being detected and measured at any selected time and determining location of the transducer in the grid through which the detected and measured energy is being transferred from an input device to an output device at such selected time and further determining the magnitude of the force applied on that transducer location as a function of the measured energy at that selected time.

27. The method of claim 26, including the steps of:
using input electrical conductors for said input devices and using output electrical conductors for said output devices;
using variable resistance devices for said transducers in which resistance varies as a function of force applied on the transducer;
converting current flowing in said output conductors to output voltage data in such a manner that the output voltage data varies as a function of the current flowing in the respective output conductors from which such voltage data is produced; and
utilizing said voltage output data to determine that magnitude of respective forces applied on respective transducer locations.

28. The method of claim 26, including the steps of:
using input electrical conductors for said input devices and using output electrical conductors for said output devices;
using variable capacitance devices for transducers in which capacitance varies as a function of force applied on the transducer;
converting current in said output conductors to output voltage data in such a manner that the output voltage data varies as a function of the current in the respective output conductors from which such voltage data is produced; and
utilizing said voltage output data to determine the magnitude of respective forces applied on the respective transducer locations.

29. The method of claim 26, including the steps of:
using input electrical conductors for said input devices and using output electrical conductors for said output devices and feeding electrical energy into said input conductors in such a manner that dynamic magnetic fields are produced around said input conductors;

positioning said input and output conductors in close enough proximity to each other in said transducers that the magnetic field around input conductors induces voltage in the output conductors and in such a manner that the distance between the input and output conductors in each transducer is variable as function of force applied on the transducer;

utilizing voltage induced in the output conductors by the magnetic field around the input conductors to determine the magnitude of respective forces applied on respective transducers.

30. The method of claim 26, including the steps of:
using light producing devices for said input devices and using output electrical conductors for said output devices;

using photovoltaic current producing devices connected to the output electrical conductors for transducers with the photovoltaic current producing devices positioned in such a manner that light intensity incident on said photovoltaic current producing devices is variable as a function of force applied on said transducer;

converting current produced by said photovoltaic current producing devices to output voltage data in such a manner that the output voltage data in such a manner that the output voltage data varies as a function of the current flowing in the respective output conductors from which such voltage data is produced; and utilizing said voltage output data to determine the magnitude of respective forces applied on respective transducer locations.

31. The method of claim 26, including the steps of:
using input optical fibers for said input devices and using output optical fibers for said output device;
feeding light energy into the input optical fibers;
transferring light from input optical fibers to output optical fibers at the transducer locations, in such a manner that the amount of light transferred from an input optical fiber to an output optical fiber varies as a function of force applied on the transducer;

utilizing the light in the output optical fibers to determine the magnitude of respective forces applied on respective transducer locations.

32. The method of claim 31, including the step of positioning the optical fibers in parallel contact with each other in said transducers in such a manner that light can transfer from an input optical fiber to an output optical fiber and the surface contact area between said input and output optical fibers and in such a manner that the surface contact area varies as a function of force applied on the transducer.

33. The method of claim 31, including the step of converting light energy in said output optical fibers to output electrical energy with photoelectric cells and utilizing the output electrical energy to determine the magnitude of respective forces applied on respective transducer locations.

* * * * *